(12) United States Patent
Brandl et al.

(10) Patent No.: US 7,427,808 B2
(45) Date of Patent: Sep. 23, 2008

(54) MICRO-SENSOR

(75) Inventors: Manfred Brandl, Gratwein (AT); Robert Csernicska, Stainz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/494,027

(22) PCT Filed: Oct. 8, 2002

(86) PCT No.: PCT/EP02/11256

§ 371 (c)(1), (2), (4) Date: Nov. 22, 2004

(87) PCT Pub. No.: WO03/038449

PCT Pub. Date: May 8, 2003

(65) Prior Publication Data

US 2005/0067695 A1    Mar. 31, 2005

(30) Foreign Application Priority Data

Oct. 29, 2001    (DE) .................... 101 53 319

(51) Int. Cl.
*H01L 23/34* (2006.01)
(52) U.S. Cl. .................................. 257/724
(58) Field of Classification Search ............. 257/724
See application file for complete search history.

(56) References Cited

U.S. PATENT DOCUMENTS 5,668,033 A * 9/1997 Ohara et al. ............... 438/113
5,831,162 A   11/1998 Sparks et al.
5,923,995 A    7/1999 Kao et al.
6,520,014 B1 * 2/2003 Brandl ...................... 73/493
2002/0170175 A1 11/2002 Aigner et al.

FOREIGN PATENT DOCUMENTS

| DE | 19617696 | 11/1997 |
|----|----------|---------|
| DE | 10027234 | 12/2000 |
| DE | 19962231 | 7/2001 |
| EP | 0 528 551 | 2/1993 |
| EP | 0 772 045 | 5/1997 |
| EP | 0828346 | 3/1998 |
| EP | 1 096 259 | 5/2001 |

OTHER PUBLICATIONS

Initial Preliminary Examination Report (Translation) for Application PCT/EP2002/011256.
Wolffenbuttel R.F. "Low-temperature intermediate Au-Si wafer bonding; eutectic or silicide bond" Sensors and Actuators A, 62 (1997) pp. 680-686.
Wolffenbuttel R.F. "Low-temperature silicon wafer to wafer bonding using gold at eutectic temperature" Sensors and Actuators A, 43 (1994) pp. 223-229.
Schmidt M.A.: "Wafer to Wafer Bonding for Microstructure Formation" Proc of the IEEE, vol. 86, No. 8, Aug. 1998 pp. 1575-1585.

* cited by examiner

*Primary Examiner*—Kiesha L Rose
(74) *Attorney, Agent, or Firm*—Fish & Richardson P.C.

(57) ABSTRACT

The present invention describes a microsensor with a sensor element (2) and an integrated circuit (1), containing a semiconductor body (11) with an intergrated circuit (4), the sensor element (2) being positioned on a main surface (12) of the semiconductor body (11) and there being a eutectic connection (3) formed between the semiconductor body (11) and the sensor element (2).

34 Claims, 2 Drawing Sheets

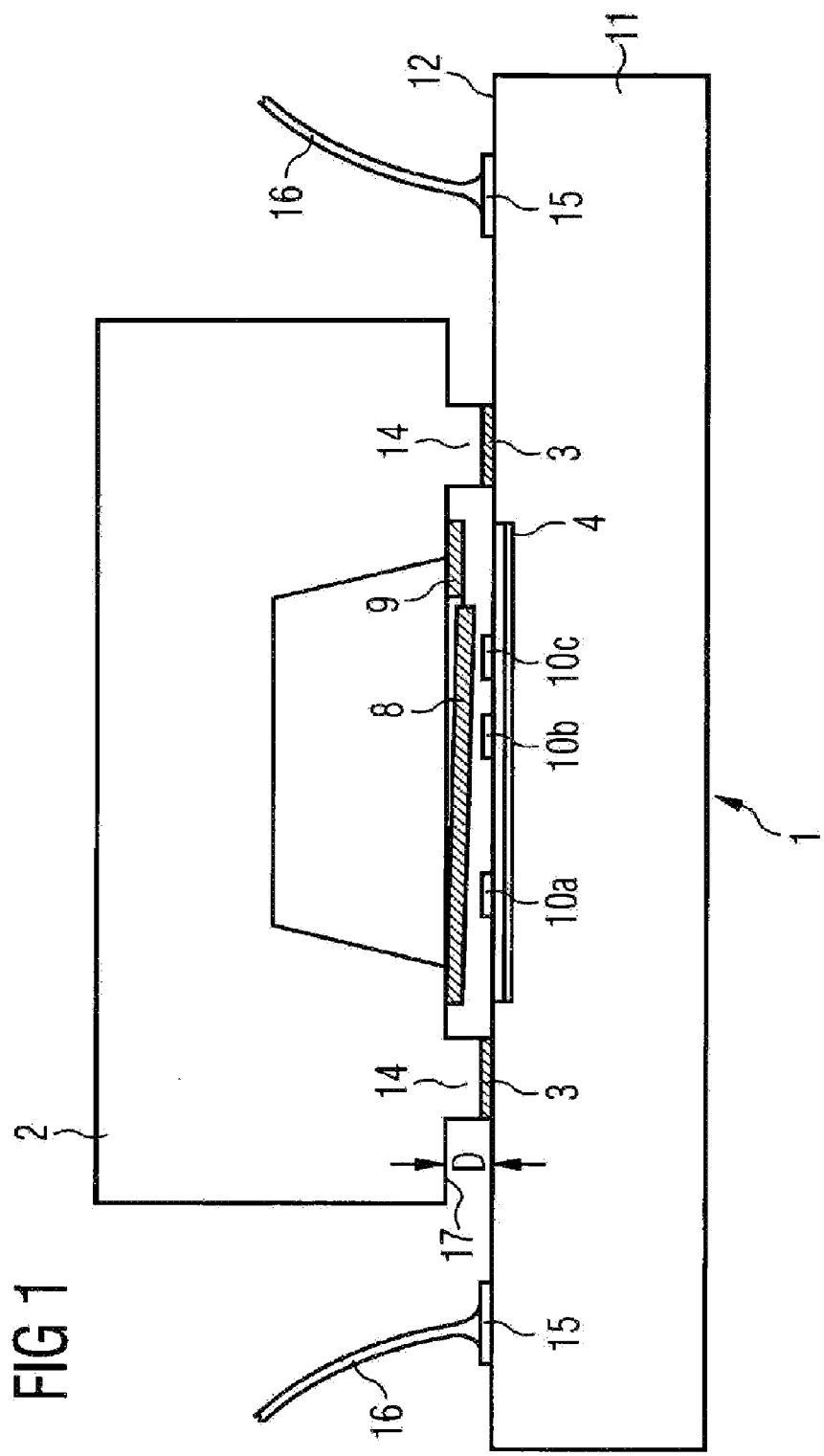

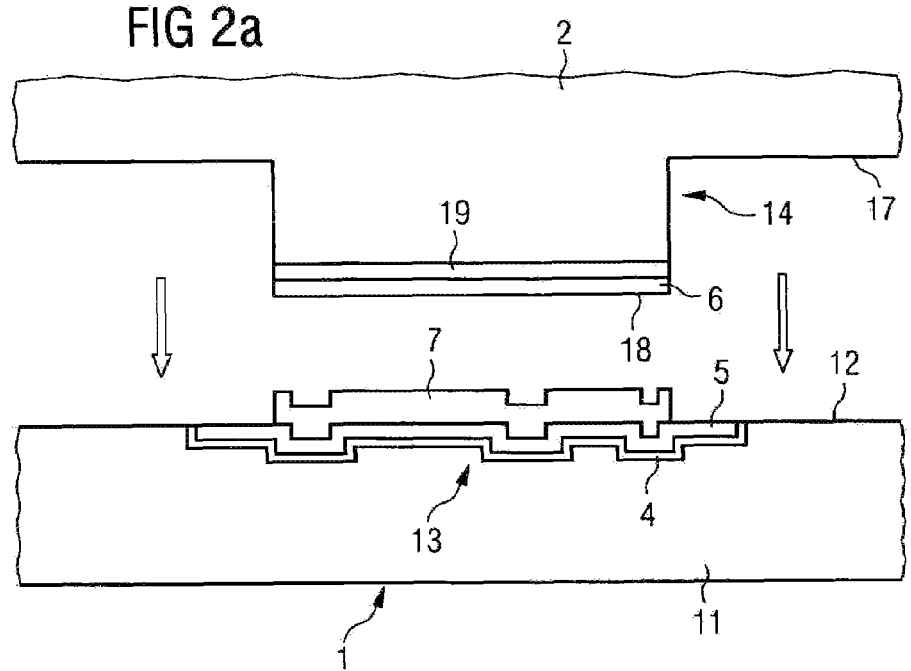
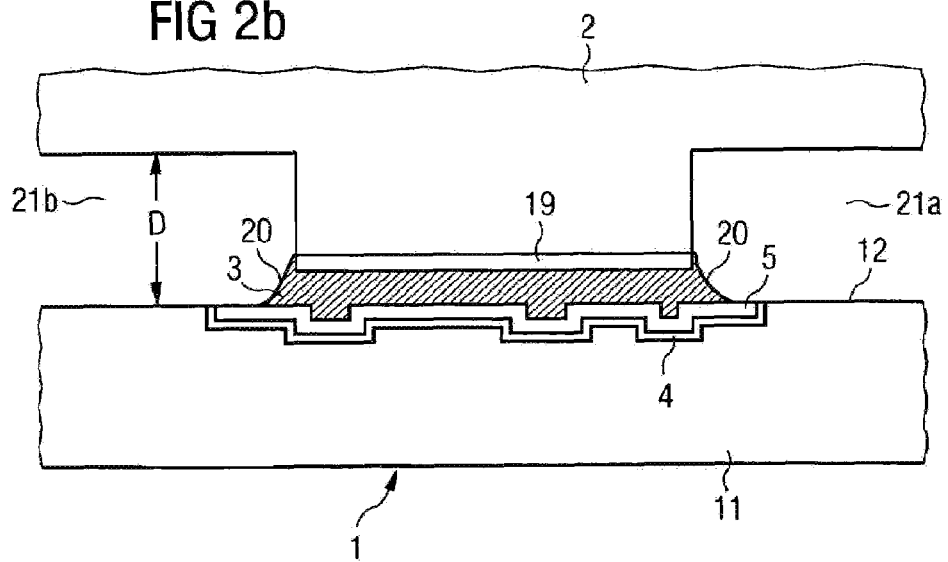

MICRO-SENSOR

TECHNICAL FIELD

The present application relates to a microsensor.

BACKGROUND

A microsensor of this sort is known, for example, from DE 100 27 234 A1. A microsensor having an integrated circuit and a micromechanical sensor element mounted on it is described there. The sensor element is mechanically and electrically connected to the integrated circuit by a soldered seam running around it. In addition, for measuring accelerations, the sensor element has a cantilever beam, whose distance from the integrated circuit is determined capacitively and converted into a measuring signal.

In an arrangement of this sort, the distance of the sensor element from the integrated circuit is the reference system and the reference for determining the position of the cantilever beam. A change in the distance of the sensor element from the integrated circuit would distort the measurement result, and therefore should be avoided. This requires a precisely defined and long-time stable connection of the sensor element with the integrated circuit. For electrical coupling, the connection should also be electrically conductive.

With a soldered connection, there is the danger that the connection will become distorted under the influence of mechanical stresses. Aging of the soldered connection can also result in a change in position of the sensor element relative to the integrated circuit. This danger is heightened significantly by a temperature increase, such as may occur, for example, when the microsensor is soldered onto a circuit board.

SUMMARY

In addition, the production of a plurality of microsensors with soldered connections in a wafer composite demands great technical effort, since many soldering surfaces must be soldered together simultaneously, with high precision.

The application is based on the task of creating a microsensor of the type noted above, having an improved connection between a sensor element and an integrated circuit. It may be possible to produce the microsensor in a wafer composite.

This problem is solved by a microprocessor as recited in claim 1. Advantageous refinements of the invention are the subject of the subordinate claims.

The application is based on the idea of connecting a micromechanical sensor element tows integrated circuit (IC) in the form of a semiconductor chip, using a eutectic connection. In particular, a sensor element based on silicon is suitable for a eutectic connection with a silicon semiconductor chip, for example a CMOS or BiCMOS IC.

The application provides for making a microsensor with a sensor element and an integrated circuit, containing a semiconductor body with an integrated circuit. The sensor element is positioned on a main surface of the semiconductor body and there is a eutectic connection form between the semiconductor body and the sensor element.

Eutectic connections, in particular eutectic silicon-gold connections, are distinguished by high mechanical stability over a wide temperature range. In particular, such connections are more stable mechanically and thermally than conventional soldered connections. Another advantage is that eutectic connections may be made very thin, so that the range that is critical in terms of a change of position is kept small.

In some embodiment, the sensor element is made of a semiconductor material, or has a semiconductor layer or a semiconductor substrate. The eutectic connection may be made, in this case, between a semiconductor surface of the sensor element and a surface of the semiconductor body of the integrated circuit.

To this end, the semiconductor body is preferably provided with a metal layer on the main surface facing the sensor element. The eutectic connection is formed, in this case, from the metal layer and the semiconductor material of the sensor element. Advantageously, this creates a very compact connection between sensor element and semiconductor body, for which in addition only a small number of connection components is needed. Alternatively, the sensor element may also be provided with a metal layer, and the eutectic connection may be formed from the material of the semiconductor body and the metal layer of the sensor element.

Preferably, for an integrated circuit or a sensor element based on silicon, a gold layer or a layer containing gold is used as the metal layer. Here, the eutectic connection uses a silicon-gold eutectic, which may be formed, for example, by joining a silicon surface and a gold surface at elevated temperature and elevated pressure.

The melting point of the silicon-gold eutectic, 363° C., is in an advantageous temperature range. The melting temperature is low enough so that the temperatures required to form the eutectic connection are harmless to the integrated circuit when the process is conducted appropriately. At the same time, the melting temperature is significantly higher than the maximum temperature that normally occurs when components are soldered onto circuit boards, which generally lies between 260° C. and 280° C. This ensures that the eutectic connection is not changed, or even undone, when soldering. If necessary, by using a metal buffer layer adjacent to the eutectic connection, the melting temperature of the eutectic connection may be raised even further through alloying with the buffer layer.

Particularly preferably, the sensor element and the integrated circuit are based on the same semiconductor material. An essentially identical composition of the semiconductor material used for the sensor element and for the integrated circuit results in advantageously low mechanical stresses between the sensor element and the integrated circuit, since both components of the microsensor have approximately the same thermal expansion coefficient.

In some embodiments, the integrated circuit is form on the main surface of the semiconductor body facing the sensor element, or in the vicinity of this main surface. This makes short electrical connections possible between the integrated circuit and the sensor element or the electrodes associated with the sensor element, which are generally characterized by short signal transit times and low susceptibility to interference. In the case of capacitive or inductive pickup or transmission a measurement signal, for example by electrodes associated with the sensor element, short electrical connections are especiallly advantageous, since the parasitic inductances and capacitances of the electrical connector are comparatively small. That largely prevents distortion of the measurement signal.

Preferably, the integrated circuit is covered by the metal layer described earlier, so that the sensor element may be positioned directly over the integrated circuit.

Between the integrated circuit and the metal layer there may be a bonding layer, which increases the adhesion of the metal layer to the semiconductor body or to the integrated circuit. An electrically conductive bonding layer is advantageous here, for example a titanium layer.

Also preferred is to have a barrier layer formed between the integrated circuit and the metal layer, which prevents diffusion of atoms from the metal layer into the integrated circuit. Such a barrier layer may also be formed advantageously in the sensor element.

If the eutectic connection is enclosed on both sides by barrier layers, that determines the extension of the eutectic connection. Advantageously, the thickness of the eutectic connection may thus be set with high precision.

DESCRIPTION OF THE DRAWINGS

Additional features, advantages and expediencies may be seen from the two exemplary embodiments described below, in combination with FIGS. 1 and 2.

FIG. 1 shows schematic sectional view of a first exemplary embodiment of a microsensor, and FIGS. 2a and 2b show a schematic partial sectional view of a second exemplary embodiment of a microsensor before and after the eutectic connection is formed.

DETAILED DESCRIPTION

Equivalent or equivalently operating elements are given the same reference symbols in the figures.

The microsensor shown in FIG. 1 has an integrated circuit 1 and a sensor element 2. Integrated circuit 1 includes a semiconductor body 11 with a main surface 12, and integrated circuit 4, which is formed on the side of main surface 12.

Sensor element 2 is positioned on main surface 12. To that end, the sensor element is placed on main surface 12 of semiconductor body 11 with a continuous projection 14 around the perimeter, and a eutectic connection 3 is formed between projection 14 and semiconductor body 11. Eutectic connection 3 will be explained in greater detail in connection with FIGS. 2a and 2b.

Sensor element 2 in the illustrated exemplary embodiment is implemented as a micromechanical sensor element for an acceleration sensor. To that end, sensor element 2 has a movable component in the form of a spring strip 8 (shown schematically in deflected position), which is surrounded by a continuous peripheral frame 9 that is positioned parallel to main surface 12 in the mounted state. The spring strip 8 is deflected from its rest position according to the magnitude of the operative acceleration, so that the distance of spring strip 8 from main surface 12 changes depending on the acceleration.

This distance is measured capacitively and is converted to an electrical measurement signal by the integrated circuit.

For the capacitive measurement there are electrodes 10 associated with the sensor element and positioned opposite electrodes 10, which may function, for example, as reference electrode 10a, measurement electrode 10c and actuator electrode 10b. Reference electrode 10a is positioned at the fixed end of spring strip 8, so that the distance from the spring strip changes only slightly even when the latter is deflected. Measurement electrode 10c, on the other hand, is located opposite the other end of spring strip 8, and thus at a location with the greatest possible deflection. An electrostatic force may be exerted on spring strip 8 through actuator electrode 10b. This makes it possible to adjust the rest position of spring strip 8. In addition, it may be used to stabilize the spring strip and vary its sensitivity.

The capacitive measurement signal impinging on electrodes 10 is processed using the integrated circuit. The integrated circuitry may include, for example, a measuring, calibrating and/or compensation circuit for that purpose. From the integrated circuit, the processed measurement signal is carried out via conductor paths (not shown), terminal areas 15 and wire terminations 16 to external connections.

The distance D between main surface 12 and the opposite surface 17 of the sensor element is of critical importance for the function of the microsensor and the precision of the measurement result. This distance D is made up of the height of projection 14, the thickness of eutectic connection 3, and the thickness of additional intermediate layers, if any. The height of the projection and the thickness of additional intermediate layers are producible with adequate precision, using known fabrication procedures such as dry etching. Since eutectic connection 3 is also formable with an exactly predetermined thickness, as already described, a prescribed distance D between main surface 12 and opposing surface 17 may be maintained very exactly during production.

Instead of a spring strip, a micromechanical sensor element may also have other movable components to register other measurable variables. For example, in the case of a pressure sensor, in place of spring strip 8 the sensor element may contain a thin membrane, preferably a silicon membrane, whose bending is measured capacitively or inductively. It is expedient, in this case, for there to be an opening in the sensor element, so that the ambient pressure being measured prevails on one side of the membrane. Other micromechanical structures, for example ones capable of vibrating or resonating, are also often used.

FIG. 2 illustrates details of a second exemplary embodiment. FIG. 2a shows the sensor element and the integrated circuit of a microsensor immediately before eutectic connection 3 is formed. FIG. 2b shows a corresponding depiction of the microsensor with eutectic connection on 3 formed.

In the illustrated exemplary embodiment, integrated circuit 1 has a semiconductor body 11 of silicon. The integrated circuit may be, for example, a CMOS or BiCMOS IC.

Sensor element 2 is also made from a silicon body. Because the same materials are chosen for the integrated circuit and the sensor element, these components of the microsensor have nearly the same thermal expansion coefficient, so that during temperature changes, in particular during a cooling phase after fabrication or when soldering the microsensor, mechanical stresses between sensor element and integrated circuit are kept small.

For microsensors based on silicon, it is especially preferred to use a silicon-gold eutectic for the eutectic connection. This eutectic is characterized by a melting temperature of 363° C., which in particular is low enough so that no damage occurs to the integrated circuit when the process is conducted appropriately.

Furthermore, a silicon-gold eutectic forms a strong, corrosion-resistant connection with long-term mechanical and thermal stability. The connection is advantageously gas-tight, and may be used to hermetically encapsulate the interior of the microsensor. This characteristic is particularly advantageous for pressure sensors. For example, a reference cell bounding on a membrane may be joined with the membrane by the eutectic connection, and thus sealed gas-tight and hermetically. In such an arrangement, the pressure to be measured results from the bending of the membrane opposite the reference cell and the reference pressure prevailing therein. The gas-tight hermetic encapsulation due to the eutectic connection ensures a constant reference pressure over time.

In general, hermetic encapsulation is advantageous for microsensors that generate the measurement signal capacitively, in order to keep the dielectric properties of the enclosed medium constant.

Instead of a silicon-gold eutectic, it is also possible to use a silicon-silver or silicon-aluminum eutectic as needed.

To form the eutectic connection, a metal layer 7, preferably a gold layer, is applied to main surface 12 of semiconductor body 11, FIG. 2a. Metal layer 7 may be produced chemically or by electroplating, by vapor deposition or sputtering, for example, a suitable masking technique being used as necessary for lateral structuring.

Structures 13, which are covered by the metal layer, may be both parts of integrated circuit 4 and, for example, conductor paths. An uninterrupted peripheral eutectic connection for encapsulating the interior of the microsensor, in particular, generally makes it necessary to run connector paths from the interior of the microsensor to the external wire connection zones. When connection paths are routed accordingly from zone 21a to zone 21b, the connection paths cross the joining direction of the eutectic connection. In this case the metal layer or eutectic connection may advantageously also cover parts of the connection paths, so that electrical insulation of the connection paths is expedient, for example with an oxide layer.

Metal layer 7 may of course also be applied directly onto main surface 12 of semiconductor body 11. In the following description, structures 13 are understood to also include main surface 12 of semiconductor body 11.

Between structures 13 and metal layer 7 there is preferably a barrier layer 5. This barrier layer 5 prevents diffusion of metal atoms from metal layer 7 into integrated circuit 4, and thus defines the extension and thickness of the eutectic connection on the side of integrated circuit 1. A silicon oxide or silicon nitride layer may be used, for example, as a barrier layer. A metal layer, which may, for example, contain palladium, platinum, tungsten and/or titanium, is also suitable as a barrier layer.

Between metal layer 7 and covered structures 13, preferably on covered structures 13, there may also be a bonding layer, for example a titanium layer, and/or a buffer layer, for example of aluminum or an aluminum alloy (not shown). A bonding layer increases the adhesion of metal layer 7 to covered structures 13, and thus improves the future anchoring of the eutectic connection to integrated circuit 1.

Sensor element 2 has a semiconductor surface on the side facing metal layer 7 in the area where the eutectic connection is to be formed, to form a semiconductor-metal eutectic. Preferably, this surface is formed by the sensor element itself or by a semiconductor layer 6 applied to the sensor element. In the latter option, semiconductor layer 6 is preferably applied to a barrier layer 19, for example of silicon oxide, silicon nitride, tungsten, titanium, palladium or platinum, which limits dispersion of atoms of the metal layer into the sensor element when the eutectic connection is formed.

Because the eutectic connection is enclosed on both sides by barrier layers 5 and 19, it is possible to determine the thickness of the eutectic connection very exactly. It should be noted, however, that the named barrier layers are advantageous but not absolutely necessary.

In the case of a sensor element based on silicon, a silicon surface is used advantageously to form the eutectic connection. The latter may be formed by the sensor element itself, or preferably by a silicon layer applied thereon. A silicon oxide or silicon nitride layer is especially suitable as the barrier layer.

A projection 14 is formed on the sensor element on the side facing integrated circuit 1, as in the exemplary embodiment shown in FIG. 1. This projection may be formed, for example, by selective removal of material. A dry etching process is particularly well suited for this, in which the distance from surface 18 of projection 14 to etched surface 17 may be determined very precisely. In the exemplary embodiment shown, this distance is about 4 µm.

Advantageously, the thickness of the silicon layer is dimensioned and matched to the thickness of the gold layer, in such a way that the quantities of silicon and gold which form the eutectic connection are already present in the stoichiometric proportions prescribed by the silicon-gold eutectic. This stoichiometric ratio is 94 weight percent gold to 6 weight percent silicon. With the same area, this corresponds to a ratio of the thickness of the gold layer to the thickness of the silicon layer of 100 to 52.

To form the eutectic connection, the sensor element and the integrated circuit are joined together so that metal layer 7 and semiconductor surface 18 come into contact. The eutectic connection forms in known manner, at elevated temperature and/or elevated contact pressure between the metal layer and the semiconductor surface.

The eutectic phase first liquefies and finally hardens to a uniform eutectic structure, which represents eutectic connection 3, FIG. 2b.

Because of the liquefaction, surface roughness and irregularities of covered structures 13 are evened out beneficially. Typically, irregularities up to about 0.5 µm are tolerable. Furthermore, a small part of the liquid eutectic is displaced in the lateral direction and solidifies in the form of a concave fillet 20. The thickness of the eutectic connection is, for example, about 1 µm.

The particular process parameters for forming eutectic connection 3, in particular contact force and temperature, depend on the materials involved. A eutectic silicon-gold connection is preferably formed at temperatures between 363° C., the melting temperature of the eutectic, and about 390° C. Through appropriate conduct of the process, it is possible to form a largely strain-free connection. This requires like temperatures of sensor element and integrated circuit when forming the eutectic connection, as well as the smallest possible lateral temperature gradient. With particular advantage, a plurality of eutectic connections may be formed simultaneously in a wafer composite.

A number of embodiments have been described. Nevertheless, it should be understood that various modifications may be made. Accordingly, other embodiments, include those not specifically described herein, are within the scope of the following claims.

The invention claimed is:

1. A microsensor comprising:
   a sensor element comprising:
      a first barrier layer; and
      a micromechanical sensor element;
   a semiconductor body comprising an integrated circuit and a second barrier layer, wherein the sensor element is on a surface of the semiconductor body, the micromechanical sensor element comprising a movable component comprising a spring strip configured to move a distance from the surface of the semiconductor body, the movable component and the semiconductor body defining a gap, a measurement signal being produced across the gap;
   one or more electrodes configured to acquire a capacitive measurement indicative of the distance; and
   a eutectic connection that couples the semiconductor body to the sensor element, the eutectic connection being between the first and second barrier layers, the first and second barrier layers limiting a thickness of the eutectic connection.

2. The microsensor of claim 1, wherein the integrated circuit is on a surface of the semiconductor body facing the sensor element.

3. The microsensor of claim 1, wherein the sensor element comprises a semiconductor material, a semiconductor layer, or a semiconductor substrate.

4. The microsensor of claim 3, wherein the semiconductor body and the sensor element contain similar semiconductor materials.

5. The microsensor of claim 4, wherein the semiconductor body and the sensor element both contain silicon.

6. The microsensor of claim 1, wherein the eutectic connection is formed using a metal layer adjacent to the second barrier layer.

7. The microsensor of claim 1, wherein the eutectic connection is formed using a semiconductor layer adjacent to the first barrier layer.

8. The microsensor of claim 6, wherein the metal layer comprises gold.

9. The microsensor of claim 8, wherein the integrated circuit is at least partly covered by the metal layer.

10. The microsensor of claim 1, wherein the thickness of the eutectic connection is determined by the first and second barrier layers.

11. The microsensor of claim 1, wherein the first barrier layer contains silicon oxide or silicon nitride.

12. The microsensor of claim 1, wherein the eutectic connection contains a silicon-gold eutectic.

13. The microsensor of claim 1, wherein the measurement signal is produced capacitively across the gap.

14. The microsensor of claim 8, wherein the integrated circuit is at least partly covered by the metal layer.

15. The microsensor of claim 1, wherein the eutectic connection is formed using a semiconductor layer adjacent to the first barrier layer and a metal layer adjacent to the second barrier layer, wherein the first barrier layer limits dispersion of atoms of the metal layer into the sensor element and the second barrier layer substantially prevents diffusion of metal atoms from the metal layer into the integrated circuit, wherein a thickness of the eutectic connection is determined by the first and second barrier layers.

16. The microsensor of claim 1, wherein the micromechanical sensor element is configured to sense an acceleration of the microsensor, wherein a distance between the spring strip and the surface of the semiconductor body depends on the acceleration.

17. The microsensor of claim 1, wherein the spring strip comprises a first end that is fixed and a second, opposite end that is moveable relative to the first end.

18. A microsensor comprising:
a sensor element comprising:
a first barrier layer; and
a micromechanical sensor element;
a semiconductor body comprising an integrated circuit and a second barrier layer, wherein the sensor element is on a surface of the semiconductor body, the micromechanical sensor element comprising a movable component comprising a spring strip, the movable component and the semiconductor body defining a gap, a measurement signal being produced across the gap; and
a eutectic connection that couples the semiconductor body to the sensor element, the eutectic connection being between the first and second barrier layers, the first and second barrier layers limiting a thickness of the eutectic connection,
wherein the micromechanical sensor element is configured to sense an acceleration of the microsensor, wherein a distance between the spring strip and the surface of the semiconductor body depends on the acceleration.

19. The microsensor of claim 18, wherein the integrated circuit is on a surface of the semiconductor body facing the sensor element.

20. The microsensor of claim 18, wherein the sensor element comprises a semiconductor material, a semiconductor layer, or a semiconductor substrate.

21. The microsensor of claim 20, wherein the semiconductor body and the sensor element contain similar semiconductor materials.

22. The microsensor of claim 21, wherein the semiconductor body and the sensor element both contain silicon.

23. The microsensor of claim 18, wherein the eutectic connection is formed using a metal layer adjacent to the second barrier layer.

24. The microsensor of claim 18, wherein the eutectic connection is formed using a semiconductor layer adjacent to the first barrier layer.

25. The microsensor of claim 23, wherein the metal layer comprises gold.

26. The microsensor of claim 25, wherein the integrated circuit is at least partly covered by the metal layer.

27. The microsensor of claim 18, wherein the thickness of the eutectic connection is determined by the first and second barrier layers.

28. The microsensor of claim 18, wherein the first barrier layer contains silicon oxide or silicon nitride.

29. The microsensor of claim 18, wherein the eutectic connection contains a silicon-gold eutectic.

30. The microsensor of claim 18, wherein the measurement signal is produced capacitively across the gap.

31. The microsensor of claim 25, wherein the integrated circuit is at least partly covered by the metal layer.

32. The microsensor of claim 18, wherein the eutectic connection is formed using a semiconductor layer adjacent to the first barrier layer and a metal layer adjacent to the second barrier layer, wherein the first barrier layer limits dispersion of atoms of the metal layer into the sensor element and the second barrier layer substantially prevents diffusion of metal atoms from the metal layer into the integrated circuit, wherein a thickness of the eutectic connection is determined by the first and second barrier layers.

33. The microsensor of claim 18, wherein the spring strip is configured to move a distance from the surface of the semiconductor body, and the microsensor further comprises:
one or more electrodes configured to acquire a capacitive measurement indicative of the distance.

34. The microsensor of claim 18, wherein the spring strip comprises a first end that is fixed and a second, opposite end that is moveable relative to the first end.

* * * * *

UNITED STATES PATENT AND TRADEMARK OFFICE
CERTIFICATE OF CORRECTION

PATENT NO. : 7,427,808 B2
APPLICATION NO. : 10/494027
DATED : September 23, 2008
INVENTOR(S) : Brandl et al.

It is certified that error appears in the above-identified patent and that said Letters Patent is hereby corrected as shown below:

On the title page, Col. 2 item [57] (Abstract), delete "The present invention describes a microsensor with a sensor element (2) and an integrated circuit (1), containing a semiconductor body (11) with an intergrated circuit (4), the sensor element (2) being positioned on a main surface (12) of the semiconductor body (11) and there being a eutectic connection (3) formed between the semiconductor body (11) and the sensor element (2)." and insert -- A microsensor includes a sensor element, such as a micromechanical sensor element, and a first integrated circuit. The first integrated circuit includes a semiconductor body and a second integrated circuit. The sensor element is on a main surface of the semiconductor body. A eutectic connection couples the semiconductor body and the sensor element. --, therefor.

Signed and Sealed this

Fourth Day of November, 2008

JON W. DUDAS
*Director of the United States Patent and Trademark Office*